US008665626B2

(12) United States Patent
Yazawa et al.

(10) Patent No.: US 8,665,626 B2
(45) Date of Patent: Mar. 4, 2014

(54) SEMICONDUCTOR INTEGRATED CIRCUIT AND CONTROL METHOD

(75) Inventors: Akira Yazawa, Kanagawa (JP); Tomohiro Iwashita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 121 days.

(21) Appl. No.: 13/235,539

(22) Filed: Sep. 19, 2011

(65) Prior Publication Data

US 2012/0069690 A1   Mar. 22, 2012

(30) Foreign Application Priority Data

Sep. 21, 2010 (JP) ................................. 2010-210781

(51) Int. Cl.
*G11C 17/00* (2006.01)
(52) U.S. Cl.
USPC .................. 365/96; 365/94; 365/225.7; 713/2
(58) Field of Classification Search
USPC ....................... 365/96, 94, 255.7, 225.7; 713/2
See application file for complete search history.

(56) References Cited

U.S. PATENT DOCUMENTS

| 6,600,683 | B2 | 7/2003 | Yamane |
| 6,912,101 | B2 | 6/2005 | Murakami et al. |
| 7,250,821 | B2 | 7/2007 | Momii et al. |
| 7,257,715 | B2 | 8/2007 | Yamane |
| 7,486,126 | B2 | 2/2009 | Shimazaki |
| 7,567,114 | B2 * | 7/2009 | Matsubara .................... 327/525 |
| 8,014,213 | B2 | 9/2011 | Yamada |
| 2001/0040750 | A1 | 11/2001 | Murakami et al. |
| 2002/0097612 | A1 | 7/2002 | Yamane |
| 2006/0017510 | A1 | 1/2006 | Momii et al. |
| 2007/0182475 | A1 | 8/2007 | Shimazaki |
| 2007/0250735 | A1 | 10/2007 | Momii et al. |
| 2009/0144559 | A1 * | 6/2009 | Lee et al. ....................... 713/189 |
| 2009/0172383 | A1 * | 7/2009 | Cumming et al. ................. 713/2 |
| 2009/0285033 | A1 | 11/2009 | Yamada |
| 2011/0080764 | A1 * | 4/2011 | Furukawa et al. .............. 365/96 |

FOREIGN PATENT DOCUMENTS

| JP | 11-65847 | 3/1999 |
| JP | 2001-282541 | 10/2001 |
| JP | 2002-7160 | 1/2002 |
| JP | 2002-299464 | 10/2002 |
| JP | 2004-54993 | 2/2004 |
| JP | 2006-39830 | 2/2006 |
| JP | 2007-243912 | 9/2007 |
| JP | 2009-277294 | 11/2009 |

OTHER PUBLICATIONS

Renesas Electronics Corporation, Multimedia Processor for Mobile Applications One Chip ARM EMMA Mobile 1-D512 MC-10118B, LogicChip+DDR SDRAM, Jun. 2010, p. 93.
Japanese Office Action dated Jan. 7, 2014 in corresponding Japanese Patent Application No. 2010-210781 with English translation of Japanese Office Action.

* cited by examiner

*Primary Examiner* — Vu Le
*Assistant Examiner* — Han Yang
(74) *Attorney, Agent, or Firm* — Young & Thompson

(57) ABSTRACT

A semiconductor integrated circuit for selecting one from a plurality of external storage devices and loading an execution program that includes a fuse part having a plurality of internal fuse circuits, and a processing unit that loads the execution program from the external storage device selected according to a value indicated by the internal fuse circuit.

13 Claims, 8 Drawing Sheets

SEMICONDUCTOR INTEGRATED CIRCUIT AND CONTROL METHOD

CROSS-REFERENCE TO RELATED APPLICATIONS

This application is based upon and claims the benefit of priority from Japanese patent application No. 2010-210781, filed on Sep. 21, 2010, the disclosure of which is incorporated herein in its entirety by reference.

BACKGROUND

1. Field of the Invention

The present invention relates to a semiconductor integrated circuit and a control method.

2. Description of Related Art

In recent years, in a semiconductor integrated circuit (system LSI etc.) mounted with a CPU (Central Processing Unit) and a DSP (Digital Signal Processor), an execution program after starting a CPU is often loaded from an external storage device such as a flash memory.

Previously, as disclosed by Renesas Electronics Corp. "Multimedia Processor for Mobile Applications One Chip ARM EMMA® Mobile 1-D512 MC-10118B (LogicChip+DDR SDRAM)", p.93, when selecting from a plurality of storage devices and loading the execution program, it is controlled in a way that by outputting a selection signal for the selection to an external terminal of a semiconductor integrated circuit, one storage device is selected from the plurality of storage devices, and the execution program such as an OS is loaded. For example, Renesas Electronics Corp. discloses that three-bit digital data (BOOT_SEL[2:0]) is input and one storage device is selected from eight storage devices. For example, when booting from SD, it will be BOOT_SEL[2:0]=010b. As described above, when receiving three-bit digital data from the external terminal, three external terminals are required.

SUMMARY

Recent LSIs are in a trend toward increasing the number of external terminals. In recent years, miniaturization of circuits progresses in the field of semiconductor integrated devices, which is leading smaller size of packages. However, there is a limit in the number of external terminals that can be disposed along with the smaller size of the packages. Therefore, when the number of external terminals increases, the package size increases, thereby generating a contradicting problem in the field where smaller size of the package is required of the package is demanded. Therefore, there have been requests for a configuration to reduce the number of external terminals as many as possible.

In the technique disclosed by Renesas Electronics Corp., three external terminals are required only for an initialization operation of LSI to select one storage device from a plurality of storage devices and load the execution program. Therefore, a mechanism is demanded which reduces the number of external terminals as many as possible without losing a selection function of a plurality of storage devices for loading the execution program.

An aspect of the present invention is a semiconductor integrated circuit for selecting one from a plurality of external storage devices, and loading an execution program that includes a fuse part having a plurality of internal fuse circuits, and a processing unit that loads the execution program from the external storage device selected according to a value indicated by the internal fuse circuit.

Another aspect of the present invention is a control method of a semiconductor integrated circuit that selects one from a plurality of external storage devices and loads an execution program that includes loading the execution program from the external storage device selected according to a value indicated by an internal fuse circuit included in the semiconductor integrated circuit.

By the present invention, it is possible to select one from the plurality of external storage devices according to the value indicated by the internal fuse circuit, and reduce the number of external terminals that receive a multi-bit selection signal corresponding to the number of the plurality of external storage devices.

According to the present invention, it is possible to reduce the number of external terminals without losing functions of a semiconductor integrated circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

[First Embodiment]

Figure 1:
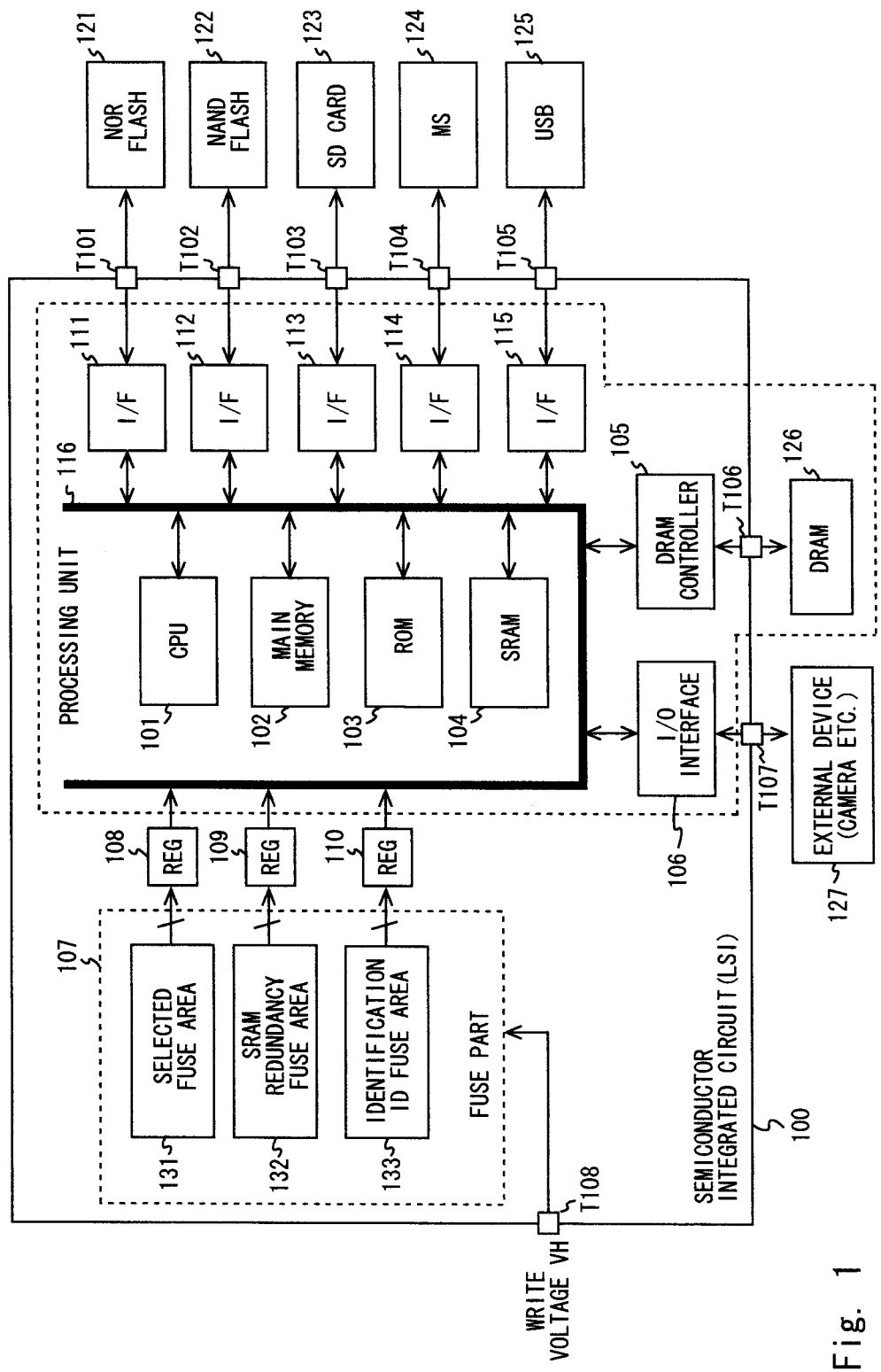
FIG. 1 is a block configuration of a semiconductor integrated circuit according to a first embodiment.

Hereinafter, a specific first embodiment incorporating the present invention is described in detail with reference to the drawings. FIG. 1 shows a block configuration of a semiconductor integrated circuit 100 according to this embodiment. As shown in FIG. 1, the semiconductor integrated circuit 100 includes a CPU 101, a main memory 102, a ROM 103, an SRAM 104, a DRAM controller 105, an I/O interface circuit 106, a fuse part 107, registers 108 to 110, interface circuits 111 to 115, a shared bus 116, and external terminals T101 to T108.

The external terminals T101 to T105 are respectively connected to an NOR flash memory 121 and a NAND flash memory 122, an SD card 123, a memory stick® 124, and an USB device 125, which are external storage devices.

The external terminals T106 and T107 are respectively connected to a DRAM device 126 and an external device, such as a camera module. The external terminal T108 receives a voltage for fuse disconnection (write voltage).

The shared bus 116 mutually connects the CPU 101, the main memory 102, the ROM 103, the SRAM 104, the DRAM controller 105, the I/O interface circuit 106, the fuse part 107, the registers 108 to 110, and the interface circuits 111 to 115.

The CPU 101 is a central controller which performs various processes inside the semiconductor integrated circuit 100 according to an execution program or input data. The CPU 101 reads a value of the register 108 and accesses the external storage device corresponding to the value. Then, the execution program is loaded from the accessed external storage device, and develops the execution program in the main memory 102. After that, a process operation corresponding to the developed execution program is performed. As the execution program, it may be an OS (Operating System) of the semiconductor integrated circuit 100 or a control program or the like of a camera module connected to the semiconductor integrated program 100. Further, a DSP (Digital Signal Processor) instead of the CPU may be used, or it may be both of them.

The main memory 102 develops the execution program and data which is necessary for the process operation of the CPU 101. With the CPU 101, the main memory 102 receives or transmits data via the shared bus 116, and writes or reads data as necessary.

The ROM 103 stores a control program, data or the like for the CPU 101 to perform processes. For example, the ROM 103 stores an initialization program etc. which is read by the CPU 101 at the time when the power of the semiconductor integrated circuit 100 turns on.

The SRAM 104 is a storage circuit capable of high-speed operations, and is used as a cache memory of the CPU 101, for example. An SRAM redundancy fuse area 132 of the later described fuse part 107 enables redundancy repair of the defective part.

The DRAM controller 105 is connected between the external terminal T106 and the shared bus 116. The DRAM controller 105 includes an interface function such as reading and writing data performed between the CPU 101 and the DRAM 126, which is connected to the external terminal T106. Note that the DRAM 126 may be a DDRAM (Double Data Rate DRAM). In such case, the DRAM controller 105 also performs control corresponding to the DDRAM. Note that in FIG. 1, the DRAM device 126 is connected outside the semiconductor integrated circuit 100, however it may be disposed inside the semiconductor integrated circuit 100.

The I/O interface circuit 106 is connected between the external terminal T107 and the shared bus 116. An external device 127, such as a camera module, is connected to the external terminal T107. The I/O interface circuit 106 has an interface function with this external device 127, and for example, transmits control data from the CPU 101, and data from the external device 127.

The interface circuits 111 to 115 are respectively connected between the external terminals T101 to T105 and the shared bus 116. The external terminals T101 to T105 are respectively connected to the NOR flash memory 121, the NAND flash memory 122, the SD card 123, the memory stick 124, and the USB device 125, which are external storage devices. The interface circuits 111 to 115 have an interface for mediating the transmission and reception of the data with the corresponding external storage devices and the internal system such as the CPU 101.

For example, the interface circuit 111 is a NOR flash controller, and has a function to control reading and writing data from and to the CPU 101, and ensure consistency of addresses and read data between the NOR flash memory 121 and the shared bus 116.

The interface circuits 111 to 115 are initially in the power-saving mode (standby mode), for example by suspending the supply of operational clocks, and an activation instruction is in an inactive state. Then, in response to the supply of the operational clocks and the activation instruction from the CPU 101, the interface circuits 111 to 115 move to the normal operation mode, and start an interface process operation with each of the corresponding external storage devices. Hereinafter, a series of operations from receiving the operational clocks and the activation instruction from the CPU 101 to moving to the normal operation mode is referred to as performing a block setup.

Accordingly, the interface circuit corresponding to the external storage device not requiring accesses from the CPU 101 does not perform the block setup, thus such interface circuit can hold the power-saving mode and reduce the power consumption of the semiconductor integrated circuit 100.

The NOR flash memory 121, the NAND flash memory 122, the SD card 123, the memory stick 124, and the USB device 125, which are external storage devices, are connected to the corresponding interface circuits respectively via the external terminals T101 to T105. The OS and the execution program processed by the CPU 101 such as the control program of the external device 127 are stored to these external storage devices, as necessary. Note that each component operating mainly on the CPU 101 such as the CPU 101, the main memory 102, the ROM 103, the interface circuits 111 to 115 or the like is referred to as a processing unit.

Figure 2:
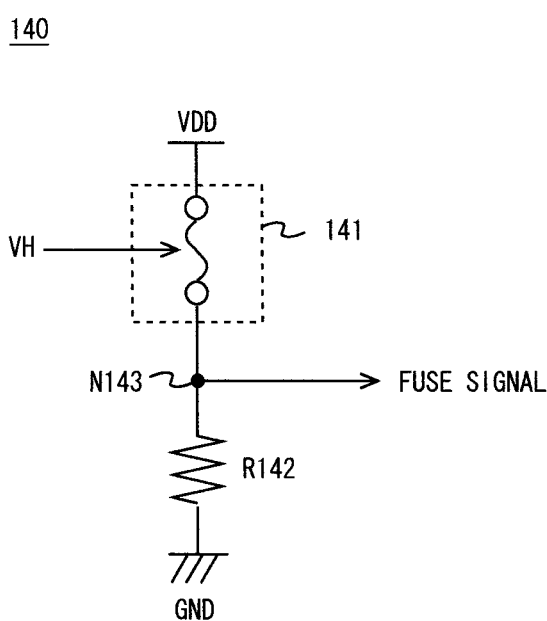
FIG. 2 is a configuration of a fuse circuit according to the first embodiment.

The fuse part 107 includes a selected fuse area 131, an SRAM redundancy fuse area 132, and an identification ID fuse area 133. The fuse part 107 includes a plurality of fuse circuits 140 as shown in FIG. 2. The register 108 is connected between the selected fuse area 131 and the shared bus 116. The register 109 is connected between the SRAM redundancy fuse area 132 and the shared bus 116. The register 110 is connected between the identification ID fuse area 133 and the shared bus 116.

An example of the configuration of the fuse circuit 140 is shown in FIG. 2. As shown in FIG. 2, the fuse circuit 140 includes a fuse element 141 and a resistor R142.

The fuse element 141 is connected between a power supply terminal VDD and a node N143. The resistor R142 is connected between the node N143 and a ground terminal GND. The node N143 corresponds to the output of the fuse circuit 140, and the potential of the node N143 will be an output signal.

An operation of the fuse circuit 140 is briefly explained. First, when not disconnected, the fuse element 141 has a lower resistance than the resistor R142. Therefore, the voltage of the node N143 increases, and output as a high-level output signal from the fuse circuit 140.

Next, when the fuse element 141 is disconnected by a high voltage VH for disconnecting the fuse element 141, the power supply terminal VDD and the node N143 are electrically insulated. Therefore, since no charge is supplied to the node N143, the voltage of the node N143 decreases and will be a ground voltage GND (a supply voltage of the ground terminal). Then a low-level output signal is output from the fuse circuit 140. Note that the high voltage VH is supplied from the external terminal T108. Also note that in the above explanation, it is explained as an example that the fuse part 107 outputs a signal according to a conductive or a non-conductive state of the fuse element 141, which is determined based on the applied voltage, however it may be other mode. For example, by applying a high voltage to an oxide film, which is insulated, and making it conductive by dielectric breakdown, it is possible to use an anti-fuse for saving data. Accordingly, the fuse part may include the anti-fuse which outputs a signal according to the conductive or the non-conductive state of the oxide film, which is determined based on the applied voltage. More generally, the fuse part is a broader concept including at least the above fuse circuit and the anti-fuse, and may be the one that outputs a signal according to the conductive or the non-conductive state of one part determined based on the applied voltage.

One fuse circuit 140 can store one bit information. For example, the value "0" is stored to the fuse circuit 140 in which the fuse element 141 is disconnected by the high voltage VH. On the contrary, the value of "1" is stored to the fuse circuit 140, in which the fuse element 141 is not disconnected. Accordingly, when regarding the output signals from the plurality of fuse circuits 140 as one signal, a signal including the bit position corresponding to the number of the fuse circuits is output from the fuse part 107.

Figure 3:
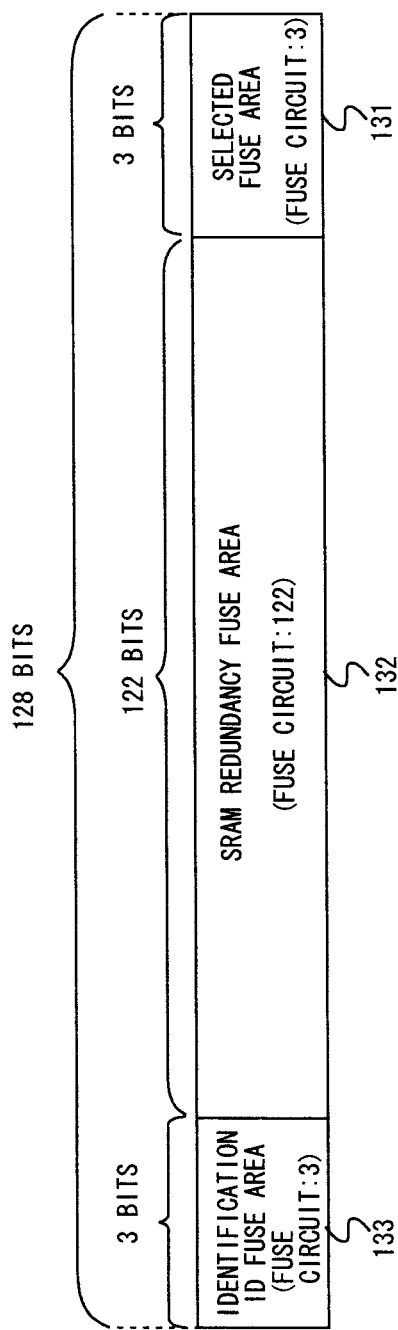
FIG. 3 is a simulated diagram of a fuse part according to the first embodiment.

The plurality of fuse circuits 140 are arranged in the fuse part 107, however the number of arranged fuse circuits 140 differs in each of the selected fuse area 131, the SRAM redundancy fuse area 132, and the identification ID fuse area 133. FIG. 3 shows an example of a simulated diagram for explaining the number of arranged fuse circuits 140 and the number of bits of the output signal for each area of the fuse part 107. However, the fuse circuit 140 for 128 bits shall be included in the entire fuse part 210.

As shown in FIG. 3, three fuse circuits 140 for three bits are arranged in the selected fuse area 131. Further, 122 fuse circuits 140 for 122 bits are arranged in the SRAM redundancy fuse area 132. Furthermore, three fuse circuits 140 for three bits are arranged in the identification ID fuse area 133.

In the abovementioned example, a three-bit output signal is output from the selected fuse area 131, and a value of the signal is stored to the register 108. The started CPU 101 selects the external storage device according to the value stored to the register 108, and loads the stored execution program to the semiconductor integrated circuit 100.

For example, when a signal of "000" is output from the selected fuse area 131, the CPU 101 selects the NOR flash memory 121. When the signals of "001", "010", "011", and "100" are output from the selected fuse area 131, the CPU 101 respectively selects the NAND flash memory 122, the SD card 123, the memory stick 124, and the USB device 125.

Note that writing data (disconnecting the fuse) to the selected fuse area 131 may be performed at the time of delivery inspection of the semiconductor integrated circuit, or may be performed after product shipment.

Moreover, a 122-bit output signal is output from the SRAM redundancy fuse area 132, and a value of the signal is stored to the register 109. A defective memory cell of the SRAM 104 is repaired according to the value stored to this register 109. For example, the redundancy process is performed by invalidating a defective row including a defective memory cell of the SRAM 104, and validating a redundant row corresponding to the value stored to the register 109. Although in this example, the output signal from the SRAM redundancy fuse area 132 is 122 bits, it is not necessary for all of 122 bits to correspond to the redundant row, but the number of bits to be effectively used may be determined according to the number of redundant row previously prepared for redundancy inside the SRAM 104.

The output signal of three bits is output from the identification ID fuse area 133, and a value of the signal is stored to the register 110. The value stored to this register 110 is an unique ID corresponding to the each of the semiconductor integrated circuit 100 to be manufactured. By reading the value stored to this register 110 at the time of performance test or the like, it is possible to improve traceability and prevent illegal use when used for cellular phones while improving management accuracy in the test process.

Figure 4:
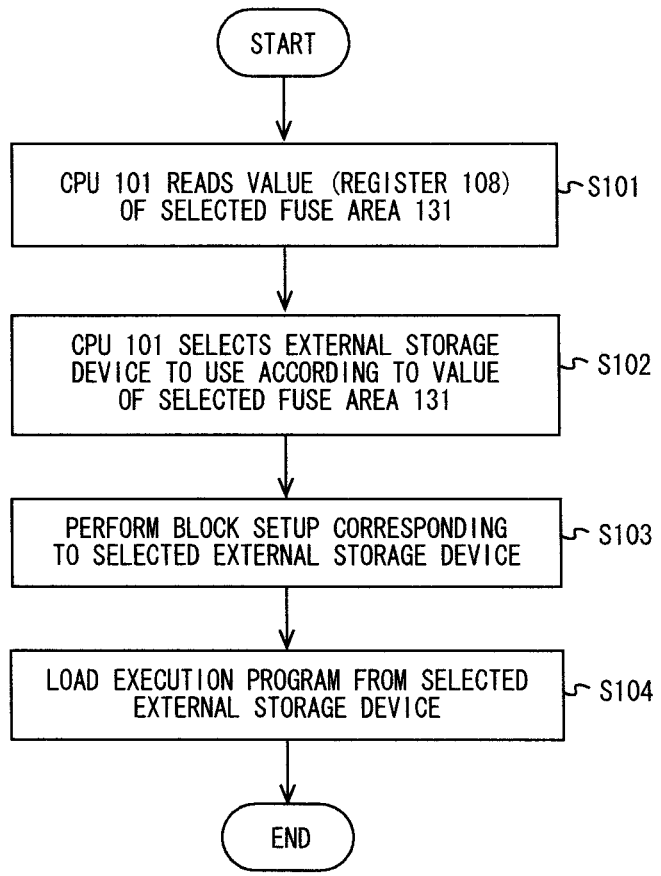
FIG. 4 is an operational flowchart of the semiconductor integrated circuit according to the first embodiment.

Next, an operation of semiconductor integrated circuit 100 according to this first embodiment is explained. FIG. 4 shows a flowchart explaining the operation of the semiconductor integrated circuit. As shown in FIG. 4, when the power of the semiconductor integrated circuit 100 turns on, the CPU 101 reads the value of the register 108 which stores the output signal of the selected fuse area 131 by the program stored to the ROM 103 (S101).

Next, the CPU 101 selects one of the plurality of external storage devices (the NOR flash memory 121, the NAND flash memory 122, the SD card 123, the memory stick 124, and the USB device 125) according to the value of the register 108 (S102).

Next, the CPU 101 performs a block setup (for example transmission of the activation instruction to the corresponding interface circuit) corresponding to the external storage device selected in the step S102 (S103).

Lastly, the CPU 101 loads the execution program stored to the external storage device selected in the step S102 inside the semiconductor integrated circuit 100 (S104), and performs the execution program according to the program.

At this time, in the related art disclosed by Renesas Electronics Corp., one external storage device is selected from the plurality of external storage devices in response to the selection signal from the external terminal, and loads the execution program such as the OS, which is stored to the selected external storage device. Although there are requests for reducing the number of external terminals along with the smaller size of the packages and an increase in the function of LSI, a plurality of external terminals (three terminals in the related art disclosed by Renesas Electronics Corp.) have been required only for the initialization operation to select the external storage device. Therefore, it has been difficult to reduce the number of external terminals of the semiconductor integrated circuit.

In the semiconductor integrated circuit 100 of this first embodiment, when selecting one from the plurality of external storage devices that stores the execution program, one external storage device is selected from the plurality of external storage devices according to bit information stored to the selected fuse area 131 inside the fuse part 107. Therefore, it is not necessary to receive the selection signals from the plurality of external terminals at the time of selecting the external storage devices, and thus it is possible to reduce the number of terminals. Accordingly, the problem in the abovementioned related art can be solved.

Moreover, in this first embodiment, the fuse circuit 140 used when selecting one from the external storage devices uses a part of the fuse part 107. Usually, the semiconductor integrated circuit (LSI) which integrated a CPU, an SRAM, or the like includes a plurality of fuse circuits, as the one explained in FIG. 3, for SRAM redundancy and for storing chip identification data. In the first embodiment, since a part of the fuse circuit for unused SRAM redundancy is used or only the fuse circuit for a few bits is added, there is an advantage of not increasing the circuit size.

Note that the execution program loaded from the external storage device may be stored to the DRAM 126 connected outside. When the capacity of the main memory 102 is small, the CPU 101 needs to frequently access the external storage device. At this time, when the external storage device is a NAND flash memory, for example, the access time with the CPU is slower than by the DRAM access. Therefore, the execution program stored to the external storage device is moved to the DRAM 126, and the CPU 101 accesses the DRAM 126 and processes the execution program, thereby generating an advantage of increasing the processing speed of the semiconductor integrated circuit 100.

[Second Embodiment]

Figure 5:
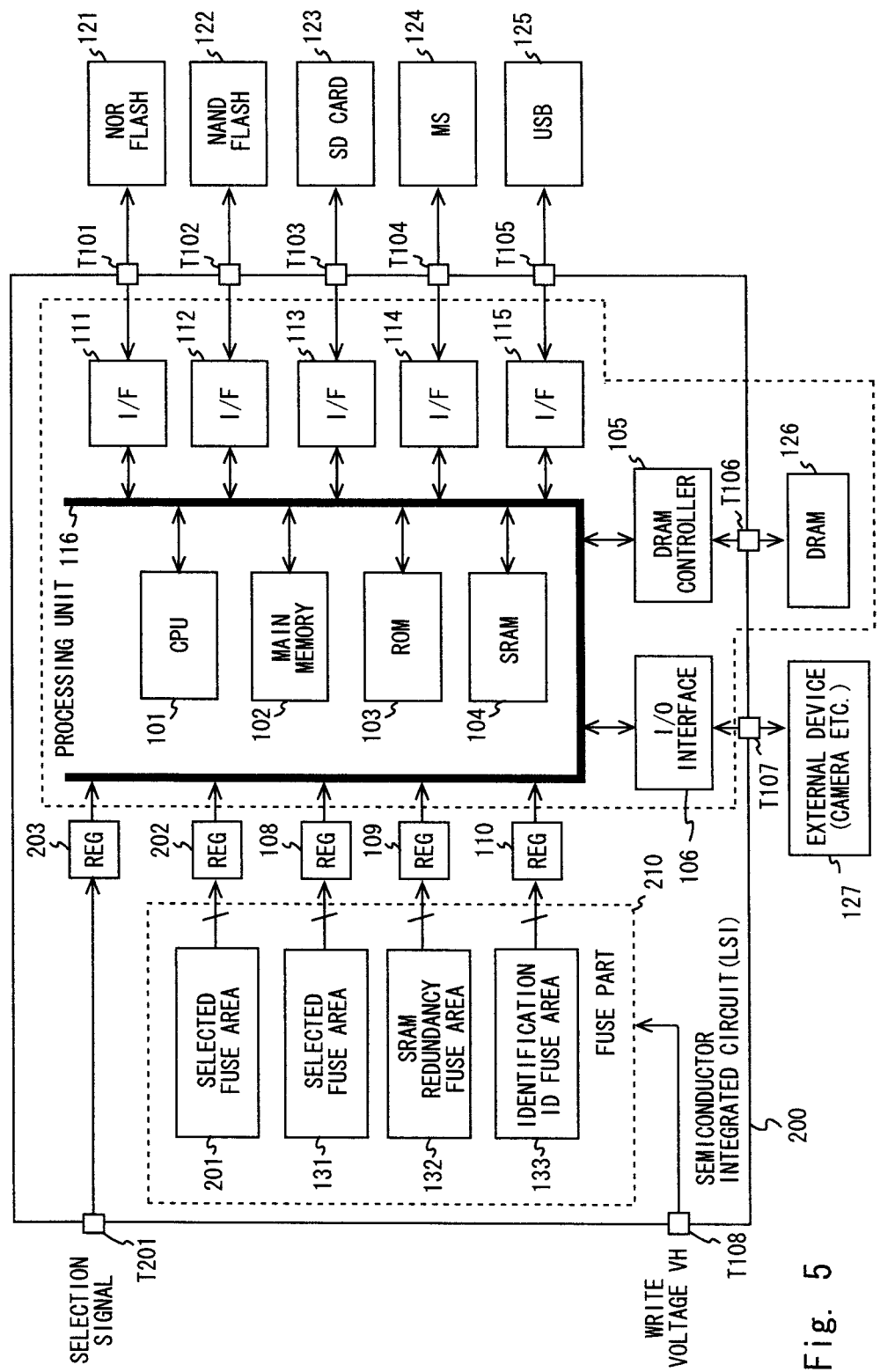
FIG. 5 is a block configuration of a semiconductor integrated circuit according to a second embodiment.

Hereinafter, a detailed second embodiment incorporating the present invention is described in detail with reference to the drawings. A block configuration of a semiconductor integrated circuit 200 according to this embodiment is shown in FIG. 5. As shown in FIG. 5, the semiconductor integrated circuit 200 includes a CPU 101, a main memory 102, a ROM 103, an SRAM 104, a DRAM controller 105, an I/O interface circuit 106, a fuse part 210, registers 108 to 110, 202, and 203, interface circuits 111 to 115, a shared bus 116, and external terminals T101 to T108 and T201.

Note that in FIG. 5, the components denoted by the same numerals as in FIG. 1 indicate the same or similar configuration as FIG. 1. Differences from the first embodiment are the configuration of the fuse part 210, and that the registers 202 and 203, and the external terminal T201 are added. Since other configuration is similar to the first embodiment, only above differences are focused in the second embodiment, and explanation of other similar configuration is omitted.

The fuse part 210 includes selected fuse areas 131 and 201, an SRAM redundancy fuse area 132, and an identification ID fuse area 133. The selected fuse area 201 is newly added to the configuration of the first embodiment.

Values other than the value stored to the selected fuse area 131 are stored to the selected fuse area 201. For example, when the selected fuse area 131 stores "000", the selected fuse area 201 stores "011".

The register 202 is connected between the selected fuse area 201 and the shared bus 116. The register 202 stores the value of the signal output from the selected fuse area 201.

The external terminal T201 receives a selection signal from outside the semiconductor integrated circuit 200. The register 203 is connected between the external terminal T201 and the shared bus 116. The register 203 stores the value of the selection signal output to the external terminal T201.

Figure 6:
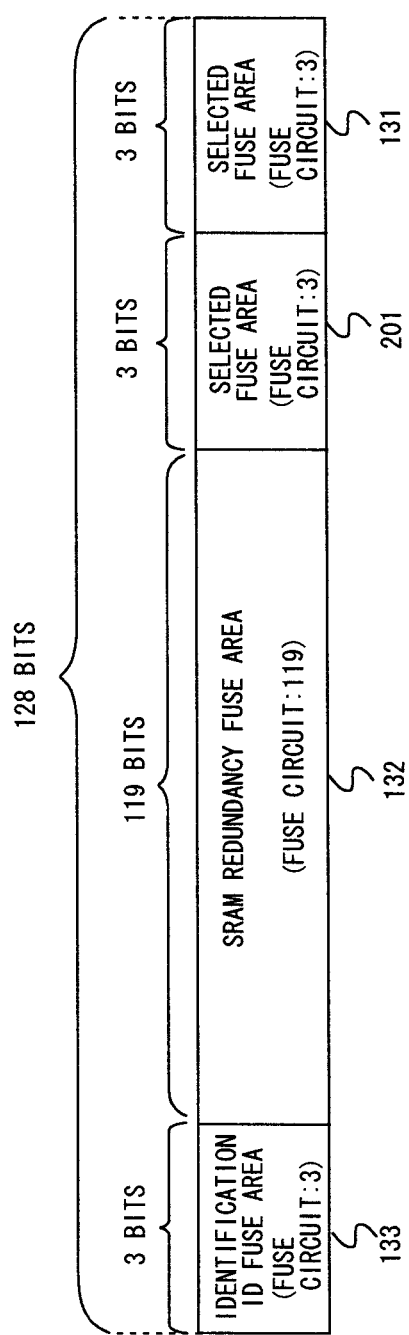
FIG. 6 is a simulated diagram of a fuse part according to the second embodiment.

FIG. 6 shows an example of a simulated diagram for explaining the number of arranged fuse circuits 140 and the number of bits of the output signal for each area of the fuse part 210. However, the fuse circuit 140 shall include the fuse circuits 140 for 128 bits in the entire fuse part 210.

As shown in FIG. 6, three fuse circuits 140 for three bits are arranged in the selected fuse area 131. Three fuse circuits 140 for three bits are arranged in the selected fuse area 201. In the SRAM redundancy fuse area 131, 119 fuse circuits 140 for 119 bits are arranged. Further, three fuse circuits 140 for three bits are arranged in the identification ID fuse area 133.

In the abovementioned example, a three-bit output signal is output from the selected fuse area 131, and a value of the signal is stored to the register 108. Moreover, a three-bit output signal will be output from the selected fuse area 201, and a value of the signal is stored to the register 202. When a one-bit selection signal is input from the external terminal T201, a value of one bit is stored to the register 203.

The started CPU 101 reads the value of the register 108 or 202 according to the value of the register 203, selects the external storage device according to the read value, and loads the stored execution program to the semiconductor integrated circuit 100. For example, when the value of the selection signal (external terminal T201) is "0", the CPU 101 reads the value of the register 108. On the other hand, when the value of the selection signal is "1", the CPU 101 reads the value of the register 202.

After that, in a similar way as the first embodiment, the CPU 101 selects the external storage device according to the value stored to the register 108 or 201, and loads the execution program.

Figure 7:
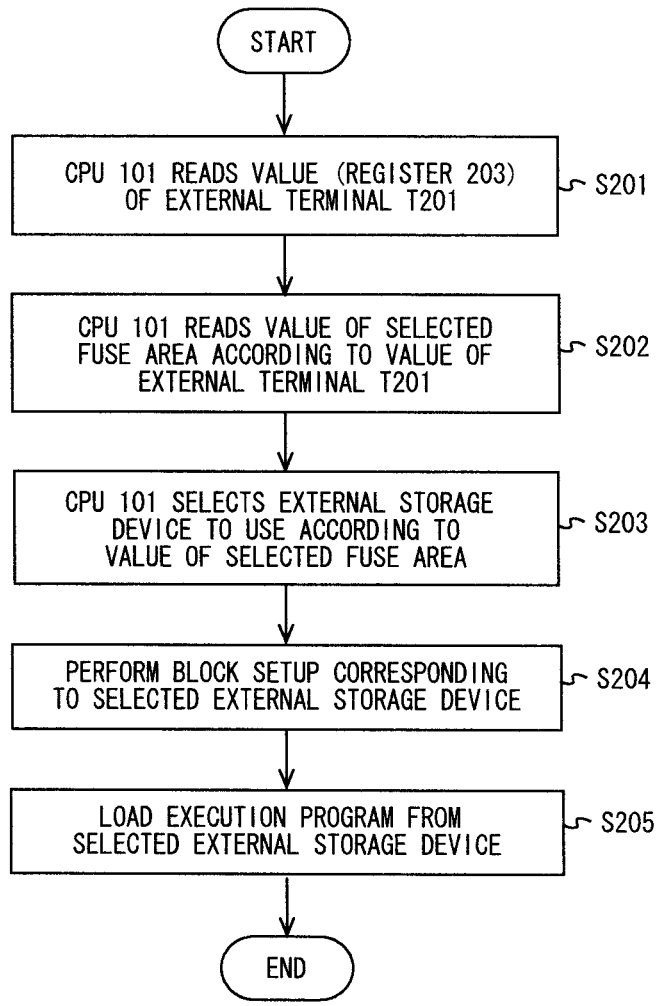
FIG. 7 is an operational flowchart of the semiconductor integrated circuit according to the second embodiment.

Next, an operation of the semiconductor integrated circuit 200 according to the second embodiment is explained. FIG. 7 shows a flowchart explaining the operation of the semiconductor integrated circuit 200. As shown in FIG. 7, when the power of the semiconductor integrated circuit 200 turns on, the CPU 101 reads the value of the register 203, which stores the value of the selection signal output to the external terminal T201, by the program stored to the ROM 103 (S201).

Next, the CPU 101 selects the register 108 or 202 according to the value read in the step S201, and reads the stored value (S202).

Next, the CPU 101 selects one of the external storage devices (the NOR flash memory 121, the NAND flash memory 122, the SD card 123, the memory stick 124, and the USB device 125) according to the value read in the step S202 (S203).

Next, the CPU 101 performs the block setup (transmission of the activation instruction to the corresponding interface or the like) corresponding to the external storage device selected in the step S203 (S204).

Lastly, the CPU 101 loads the execution program stored to the external storage device selected in the step S202 inside the semiconductor integrated circuit 100 (S205), and performs an execution process to the program.

At this time, in the first embodiment, once the value is stored to the selected fuse area 131, only the external storage device corresponding to the value can be accessed. However, in the second embodiment, the external storage device to access can be changed according to the value of the signal received from the external terminal T201. Therefore, it is possible to access the external storage device corresponding to the value of the register 108 at the time of product inspection, and the external storage device corresponding to the value of the register 201 after the product shipment.

At this time, although the external terminal T201 is newly added, the number of external terminals can be reduced more as compared to the case of selecting two from the plurality of external storage devices by the external terminals as in the related art. Then, as in the above example, for example, when the number of the external storage devices is five or more, the digital selection signal will be n=3 from Log 2(5)≤n, and at least three external terminals for receiving the selection signal are required. However, in the second embodiment, the information for selecting two external storage devices from five external storage devices is included in the selected fuse areas 131 and 201 and does not require the selection signal from the external terminals, thus only one-bit signal for switching the selected fuse areas is required. Therefore, there are advantages in which it is possible to reduce the number of terminals more than in the related art, and perform the selection control of the external storage devices more flexibly than in the first embodiment.

Figure 8:
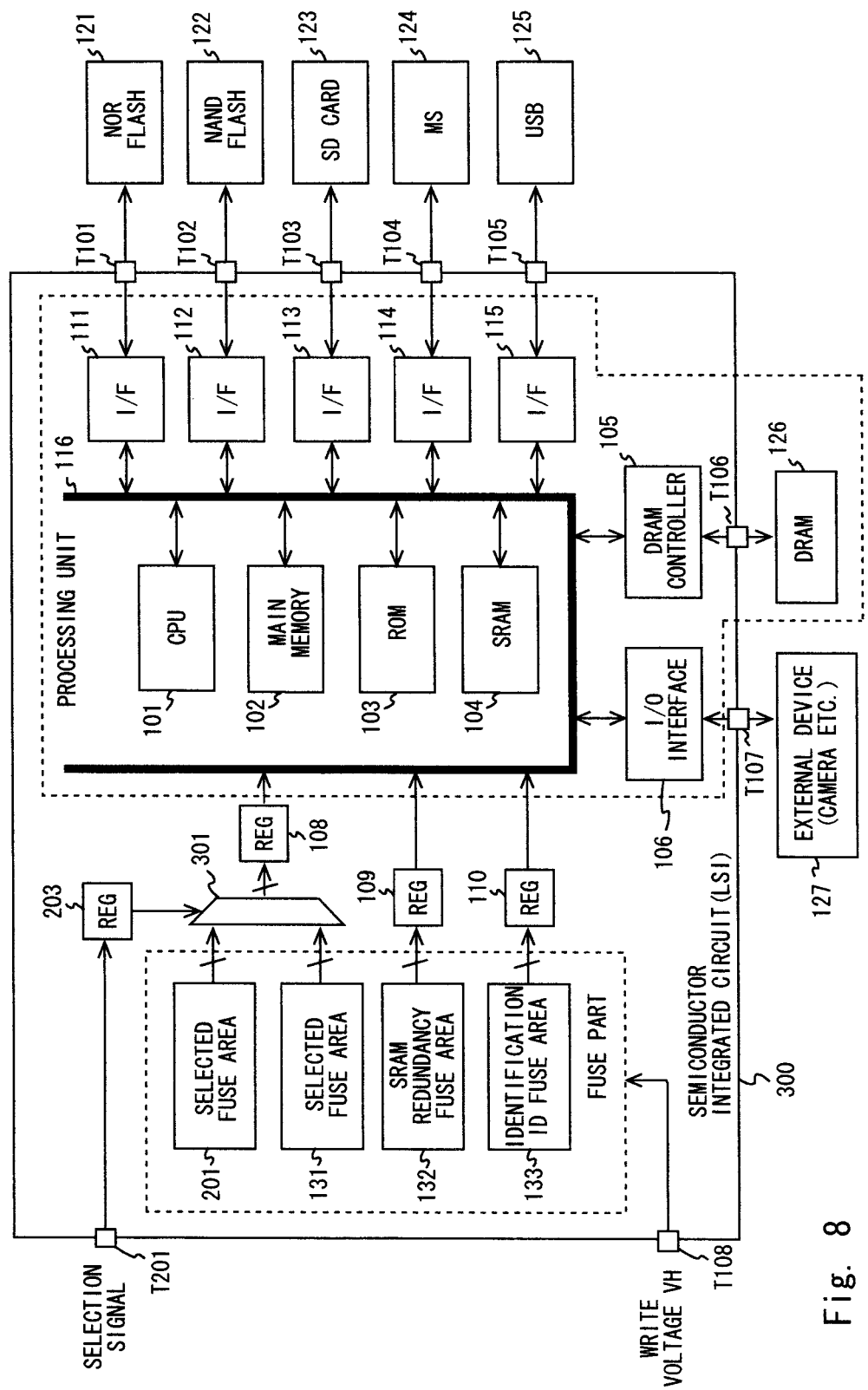
FIG. 8 is a block configuration of the semiconductor integrated circuit according to the second embodiment.

Moreover, a configuration of a semiconductor integrated circuit 300 shown in FIG. 8 is also possible as a variation of the second embodiment. As shown in FIG. 8, the semiconductor integrated circuit 300 includes a CPU 101, a main memory 102, a ROM 103, an SRAM 104, a DRAM controller 105, an I/O interface circuit 106, a fuse part 210, registers 108 to 110, and 301, interface circuits 111 to 115, a shared bus 116, a selection circuit 301, and external terminals T101 to T108 and T201.

Note that in FIG. 8, the components denoted by the same numerals as in FIG. 5 indicate the same or similar components as FIG. 5. A difference from the semiconductor integrated circuit 200 of FIG. 5 is that the selection circuit 301 is included.

In the semiconductor integrated circuit 300, the selection circuit 301 selects a signal from either of the selected fuse area 131 or 201 according to the value of the register 202 which stores the value of the selection signal output to the external terminal T201. For example, when the value of the register 202 is "0", the selection circuit 301 selects the signal from the selected fuse area 131. When the value of the register 202 is "1", the selection circuit 301 selects the signal from the selected fuse area 201. Then, the value of the signal selected by the selection circuit 301 is stored to the register 108. After that, in a similar way as the operation of the first embodiment (FIG. 4), the started CPU 101 selects the external storage device according to the value stored to the register 108, and loads the stored execution program to the semiconductor integrated circuit 300.

In the semiconductor integrated circuit 300, the external storage device is selected by hardware, which is performed by software in the CPU 101, thus a faster process can be performed as compared to the semiconductor integrated circuit 200.

The present invention is not limited to the above embodiments, but may be modified without departing from the scope. For example, although the external storage device is selected according to the value stored to the selected fuse area, the value may be written to the ROM. Then, the CPU 101 may select the external storage device according to the value written to the ROM. Even in this case, it is possible to reduce the number of terminals in a similar manner as the first and the second embodiments. However, it should be noted that as it is costly to change the mask of ROM, the first and the second embodiments can change the selected external storage device with less cost and more flexibly depending on an end user of the semiconductor integrated circuit.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit for selecting one from a plurality of external storage devices, and loading an execution program, the semiconductor integrated circuit comprising:
a fuse part including an internal fuse circuit;
a processing unit that loads the execution program from the external storage device selected according to a value indicated by the internal fuse circuit; and
a first register that stores an output signal from the fuse part, wherein the processing unit is a CPU of the semiconductor integrated circuit, and the CPU selects one from the plurality of external storage devices according to a value of the first register.

2. The semiconductor integrated circuit according to claim 1, further comprising an SRAM, wherein
the fuse part comprises:
a selected fuse area that outputs a signal to the first register; and
a redundancy area that includes a fuse circuit for redundancy that repairs a defective cell of the SRAM.

3. The semiconductor integrated circuit according to claim 1, wherein the execution program loaded from the external storage device selected according to the value indicated by the internal fuse circuit is stored inside the semiconductor integrated circuit or to an external DRAM.

4. The semiconductor integrated circuit according to claim 1, further comprising a first external terminal, wherein
the fuse part comprises a first selected fuse area and a second selected fuse area, and
the processing unit selects one of the first selected fuse area and the second selected fuse area according to a value indicated by the first external terminal, and loads the execution program from the external storage device selected according to the value indicated by the internal fuse circuit of the selected fuse area being selected.

5. The semiconductor integrated circuit according to claim 4, wherein the first register stores an output signal from the first selected fuse area, and wherein the semiconductor integrated circuit further comprises;
a second register that stores an output signal from the second selected fuse area; and
a third register that stores a value of a signal output to the first external terminal,
wherein the CPU selects one of the first register and the second register according to a value of the third register, and selects one from the plurality of external storage devices according to a value of the selected register.

6. The semiconductor integrated circuit according to claim 5, further comprising an SRAM, wherein
the fuse part comprises:
a first selected fuse area and a second selected fuse area; and
a redundancy area that includes a fuse circuit for redundancy that repairs a defective cell of the SRAM.

7. The semiconductor integrated circuit according to claim 4, wherein the execution program loaded from the external storage device selected according to the value indicated by the internal fuse circuit of the selected fuse area is stored inside the semiconductor integrated circuit or to an external DRAM.

8. A control method of a semiconductor integrated circuit that selects one from a plurality of external storage devices and loads an execution program, the control method comprising:
storing in a first register an output signal from an internal fuse circuit of the semiconductor integrated circuit;
a CPU of the semiconductor integrated circuit selecting one from the plurality of external storage devices according to a value of the first register; and
loading the execution program from the selected external storage device.

9. The control method of the semiconductor integrated circuit according to claim 8, wherein
the output signal from the internal fuse circuit includes a first value and a second value,
one of the first value and the second value is selected according to a signal from outside the semiconductor integrated circuit, and
the execution program is loaded from the external storage device selected according to selected one of the first value and the second value.

10. The control method of the semiconductor integrated circuit according to claim 8, further comprising storing the execution program loaded from the selected external storage device inside the semiconductor integrated circuit or to an external DRAM.

11. A semiconductor integrated circuit comprising:
- a fuse part that outputs a signal according to one of a conductive state and a non-conductive state of one part determined according to an applied voltage;
- a processing unit that selects one storage device from a plurality of storage devices connected outside according to a value of a signal output by the fuse part, and loads an execution program from the selected one of the storage device; and
- a first register that stores the signal output from the fuse part,
- wherein the processing unit is a CPU of the semiconductor integrated circuit, and the CPU selects one from the plurality of storage devices according to a value of the first register.

12. The semiconductor integrated circuit according to claim 11, wherein the fuse part is a fuse circuit that outputs a signal corresponding whether or not a fuse element, which is the one part, is disconnected by the applied voltage.

13. The semiconductor integrated circuit according to claim 11, wherein the fuse part is an anti-fuse that outputs a signal corresponding whether or not an oxide film, which is the one part, is in a dielectric breakdown state by the applied voltage.

* * * * *